United States Patent
Yoon et al.

(10) Patent No.: US 7,567,017 B2
(45) Date of Patent: Jul. 28, 2009

(54) PIEZOELECTRIC LINEAR MOTOR WITH DISPLACEMENT AMPLIFYING MEANS

(75) Inventors: Seok Jin Yoon, Seoul (KR); Hyun Jai Kim, Seoul (KR); Hyun Phill Ko, Seoul (KR); Chong Yun Kang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 553 days.

(21) Appl. No.: 11/319,258

(22) Filed: Dec. 27, 2005

(65) Prior Publication Data
US 2006/0261706 A1 Nov. 23, 2006

(30) Foreign Application Priority Data
May 18, 2005 (KR) .................. 10-2005-0041376

(51) Int. Cl.
*H01L 41/08* (2006.01)
(52) U.S. Cl. ............................................... 310/328
(58) Field of Classification Search .................. 310/328
See application file for complete search history.

(56) References Cited

U.S. PATENT DOCUMENTS

| | | | | |
|---|---|---|---|---|
| 4,570,095 A | * | 2/1986 | Uchikawa | 310/328 |
| 4,783,610 A | * | 11/1988 | Asano | 310/328 |
| 4,929,859 A | * | 5/1990 | Suzuki et al. | 310/328 |
| 4,933,591 A | * | 6/1990 | Stahlhuth | 310/328 |
| 5,479,064 A | * | 12/1995 | Sano | 310/328 |
| 2006/0245950 A1 | * | 11/2006 | Vogeley | 417/413.2 |
| 2007/0120442 A1 | * | 5/2007 | Piotr et al. | 310/323.01 |

FOREIGN PATENT DOCUMENTS

JP 5-191988 7/1993
KR 10-2005-0041376 9/2006

* cited by examiner

*Primary Examiner*—Jaydi SanMartin
(74) *Attorney, Agent, or Firm*—Jones Day

(57) ABSTRACT

A piezoelectric linear motor for amplifying the change in at least one dimension of a piezoelectric material is disclosed. A shaft is connected axial-movably to a piezoelectric actuator. The actuator includes a piezoelectric ceramic that expands or contracts in response to an applied voltage. The expansion or contraction of the piezoelectric ceramic is amplified by converting the displacement due to expansion/contraction into a greater displacement of a top plate to which the shaft is coupled. The greater displacement is, for instance, by causing the expansion/contraction of the piezoelectric ceramic into a convex or concave bending of a complex of which the piezoelectric ceramic is a part. In a preferred embodiment the base plate is attached to the piezoelectric ceramic, a slanted plate conically extending from the base plate, and a top plate formed at the center of the slanted plate to form an assembly that changes its curvature to amplify the displacement.

2 Claims, 5 Drawing Sheets

PIEZOELECTRIC LINEAR MOTOR WITH DISPLACEMENT AMPLIFYING MEANS

FIELD OF THE INVENTION

The present invention relates to a piezoelectric linear motor, and more particularly to a piezoelectric linear motor having means for amplifying the displacement caused by a piezoelectric actuator.

BACKGROUND OF THE INVENTION

FIG. 1 schematically shows a piezoelectric linear motor of the prior art. As shown in the drawing, piezoelectric ceramics 2 are stacked upon one another. As further shown in the drawing, a shaft 4 is coupled to the rightmost piezoelectric ceramic 2" of the stacked ceramics 2. The leftmost piezoelectric ceramic 2' of the stacked ceramics 2 is fixed to a supporting part 6 of an instrument or a device to which the piezoelectric linear motor is installed.

The reference numeral 8 indicates a driving circuit that is electrically connected to the piezoelectric ceramics 2 for applying a voltage thereto. The piezoelectric ceramics 2 expand when the voltage is applied and contract when the voltage is removed. The shaft 4 moves axially according to the expansion or contraction of the piezoelectric ceramics 2.

A moving element 9 is mounted to the shaft 4 such that the moving element 9 frictionally interacts with the shaft 4. When the shaft 4 moves relatively slowly, the moving element 9 moves linearly together with the shaft 4 by the friction therebetween. However, when the shaft 4 moves relatively fast, since the friction-acting time is shortened, the moving element 9 does not move by inertia. Rather, only the shaft 4 moves axially. Since the process of adjusting the moving speed of the shaft 4 by controlling the voltage wave applied to the piezoelectric ceramics 2 is already well known in this art, the explanation thereof is omitted herein.

As the low-speed forward movement (as indicated by arrow a) and the high-speed backward movement (as indicated by arrow b) of the shaft 4 are repeated, the moving element 9 gets to move forward. However, as the low-speed backward movement and the high-speed forward movement of the shaft 4 are repeated, the moving element 9 gets to move backward. An object to be moved, such as a photo lens, is fixed to the moving element 9.

However, the above prior art piezoelectric linear motor is limited in the displacement of the moving element 9 by the expansion or contraction of the stacked piezoelectric ceramics 2, thus making it difficult to displace the moving element 9 to a target position within a short time with a large driving force.

SUMMARY OF THE INVENTION

It is an object of the present invention to overcome the problems of the prior art and provide a piezoelectric linear motor, which can amplify the displacement of a moving element caused by expansion or contraction of a piezoelectric actuator.

Consistent with the foregoing object and in accordance with one aspect of the present invention as embodied herein, there is provided a piezoelectric linear motor comprising: a piezoelectric actuator capable of expansion and contraction, the piezoelectric actuator including a piezoelectric ceramic that expands or contracts when a voltage is applied; a shaft axial-movably connected to the piezoelectric actuator; a moving element mounted to the shaft, the moving element being frictionally displaced relative to the shaft; and means for amplifying the displacement of the shaft and the moving element, the means being interposed between the piezoelectric actuator and the shaft. The means for amplifying the displacement is elastically deformed when the piezoelectric actuator expands or contracts to thereby axially move the shaft with an amplified displacement.

Preferably, the means for amplifying the displacement includes: a base plate attached to the piezoelectric ceramic; a slanted plate conically extending from the base plate; and a top plate formed at the center of the slanted plate, to which the shaft is coupled. The base plate is deformed to have a convex or concave cross-section when the piezoelectric ceramic expands or contracts. Further, the top plate moves along the axis of the shaft according to the deformation of the base plate.

Preferably, the piezoelectric actuator further includes an elastic member that is attached to the piezoelectric ceramic and deformed to have a convex or concave cross-section when the piezoelectric ceramic expands or contracts.

BRIEF DESCRIPTION OF DRAWINGS

The above object and features of the present invention will become more apparent from the following description of the preferred embodiments given in conjunction with the accompanying drawings.

DETAILED DESCRIPTION OF THE PRESENT INVENTION

Preferred embodiments of the present invention will now be described with reference to the accompanying drawings.

Figure 1:
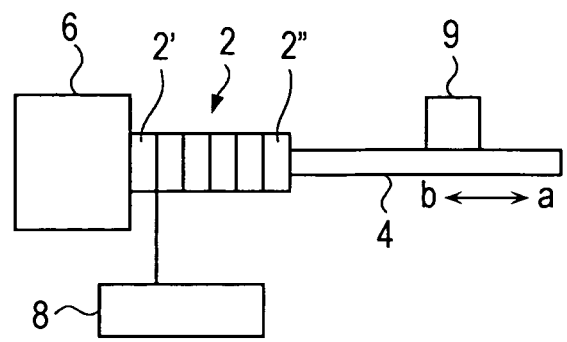
FIG. 1 schematically shows a piezoelectric linear motor of the prior art.
Figure 2:
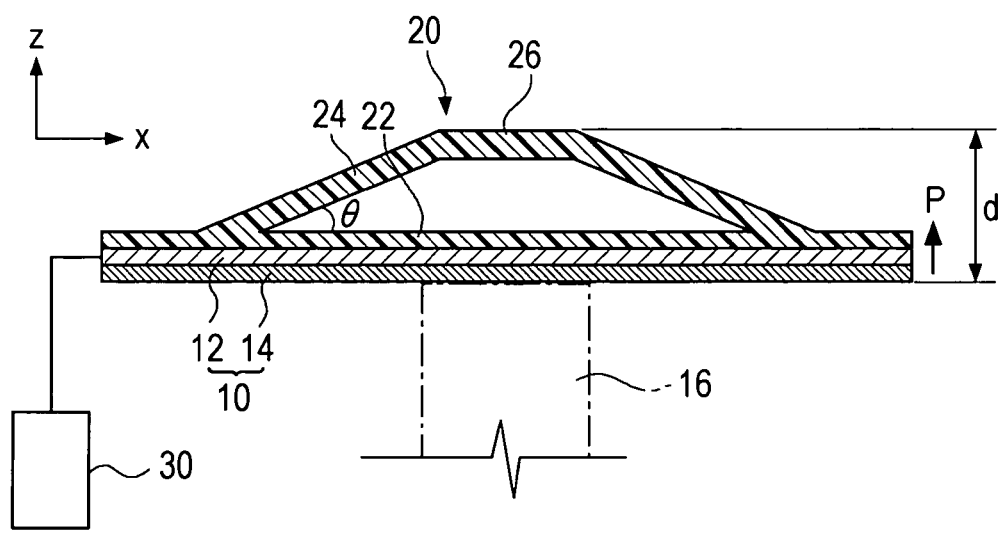
FIG. 2 is a cross-sectional view schematically showing a piezoelectric actuator and displacement amplifying means of a piezoelectric linear motor constructed in accordance with the present invention.

FIG. 2 is a cross-sectional view schematically showing a piezoelectric actuator and displacement amplifying means of a piezoelectric linear motor, which is constructed in accordance with the present invention.

As shown in the drawing, a displacement amplifying means 20 is mounted onto a piezoelectric actuator 10 capable of expansion and contraction. The piezoelectric actuator 10 includes a plate-shaped piezoelectric ceramic 12 disposed in a direction of x-axis. It also includes a plate-shaped elastic member 14 attached to the piezoelectric ceramic 12. The center portion of the elastic member 14 is fixed to a supporting part 16 of an instrument or a device to which the piezoelectric linear motor is installed. The reference numeral 30 indicates a driving circuit for applying a voltage to the piezoelectric ceramic 12. When the voltage is applied to the piezoelectric ceramic 12, the piezoelectric ceramic 12 expands or contracts. Attaching the elastic member 14 to the piezoelectric ceramic 12 solves the problem in which the durability of the motor becomes deteriorated due to the brittleness of the piezoelectric ceramic 12.

The displacement amplifying means 20 includes: a base plate 22 attached to the piezoelectric ceramic 12 opposite to the elastic member 14; a slanted plate 24 extending conically from the surface of the base plate 22 opposite to the piezoelectric ceramic 12 with a predetermined acute angle θ, and a top plate 26 formed at the center of the slanted plate 24. The top plate 26 is in parallel with the piezoelectric ceramic 12 (i.e., in the direction of x-axis) and is located apart from the upper end of the supporting part 16 with a distance d. These plates 22, 24 and 26 of the displacement amplifying means 20 are preferably fabricated from an elastic material.

Figure 3:
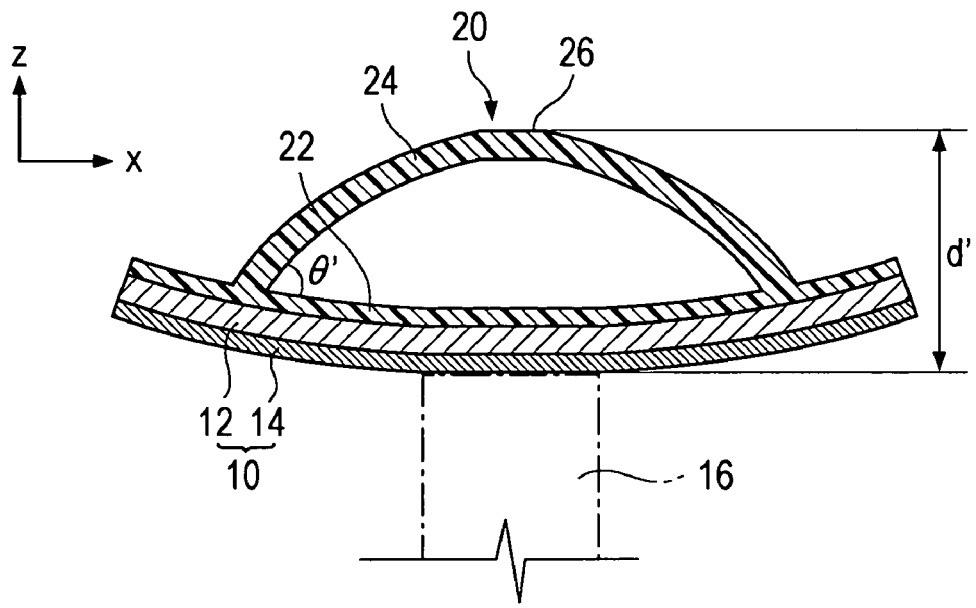
FIG. 3 is a cross-sectional view showing an operating state of a piezoelectric actuator and displacement amplifying means of FIG. 2.
Figure 4:
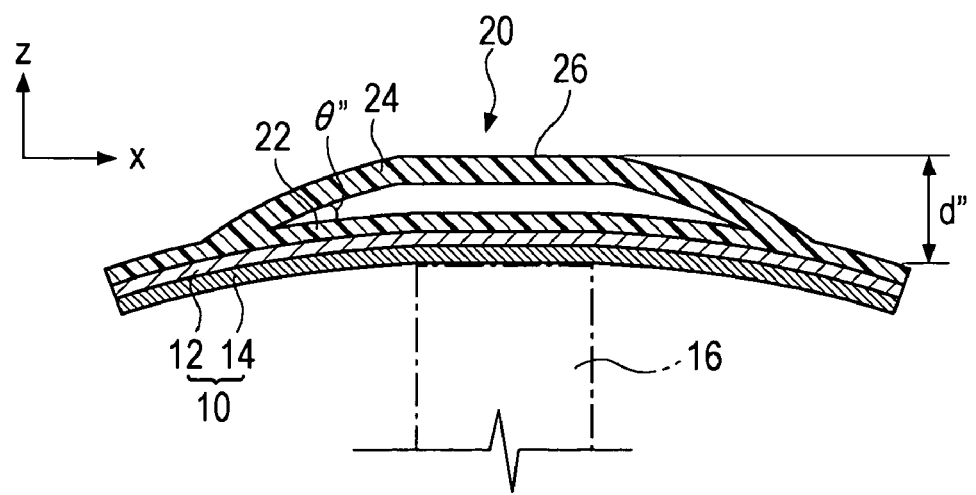
FIG. 4 is a cross-sectional view showing another operating state of a piezoelectric actuator and displacement amplifying means of FIG. 2.

FIGS. 3 and 4 are cross-sectional views showing the operating states of the piezoelectric actuator and the displacement amplifying means when the voltage is applied to the piezoelectric ceramic.

If an electric field applied to the piezoelectric ceramic 12 is same as the direction of the polarization (as indicated by arrow p in FIG. 2) of the piezoelectric ceramic 12, then the piezoelectric ceramic 12 expands in the direction of z-axis and contracts in the direction of x-axis (as shown in FIG. 3). Thus, the elastic member 14, which is attached to the piezoelectric ceramic 12 and fixed to the supporting part 16 at its center portion, is deformed together with the piezoelectric ceramic 12, to have a convex-down cross-section on the supporting part 16. At the same time, the base plate 22 of the displacement amplifying means 20, which is attached to the piezoelectric ceramic 12, is also deformed to have a convex-down cross-section. Accordingly, the angle θ (see FIG. 2) between the base plate 22 and the slanted plate 24 of the displacement amplifying mean 20 becomes increased to an angle θ'(θ'>θ). As a result, the top plate 26 formed at the center of the slanted plate 24 is displaced away from the upper end of the supporting part 16 with a distance d'(d'>d) in the direction of z-axis. That is, the displacement (d'−d) of the top plate 26 from the upper end of the supporting part 16 includes the displacement of the piezoelectric actuator 10 and the displacement of the displacement amplifying means 20.

On the contrary, if the electric field applied to the piezoelectric ceramic 12 is reverse to the direction of the polarization (as indicated by arrow p in FIG. 2) of the piezoelectric ceramic 12, the piezoelectric ceramic 12 expands in the direction of x-axis and contracts in the direction of z-axis (as shown in FIG. 4). Thus, the elastic member 14, which is attached to the piezoelectric ceramic 12 and fixed to the supporting part 16 at its center portion, is deformed together with the piezoelectric ceramic 12, to have a convex-up (i.e., concave-down) cross-section on the supporting part 16. At the same time, the base plate 22 of the displacement amplifying means 20, which is attached to the piezoelectric ceramic 12, is also deformed to have a convex-up (i.e., concave-down) cross-section. Accordingly, the angle θ (see FIG. 2) between the base plate 22 and the slanted plate 24 of the displacement amplifying means 20 becomes decreased to an angle θ"(θ"<θ). As a result, the top plate 26 formed at the center of the slanted plate 24 is displaced toward the upper end of the supporting part 16 with a distance d"(d"<d) in the direction of z-axis.

Thus, the above configuration of the displacement amplifying means 20 can amplify the displacement of the top plate 26 based on the upper end of the supporting part 16. The elastic member 14 is not essential for achieving the displacement amplifying effect. The construction of the piezoelectric ceramic 12 and the displacement amplifying means 20 may be diversely modified so that the displacement amplifying means 20 can be geometrically deformed without the elastic member 14 when the piezoelectric ceramic 12 expands or contracts.

Figure 5:
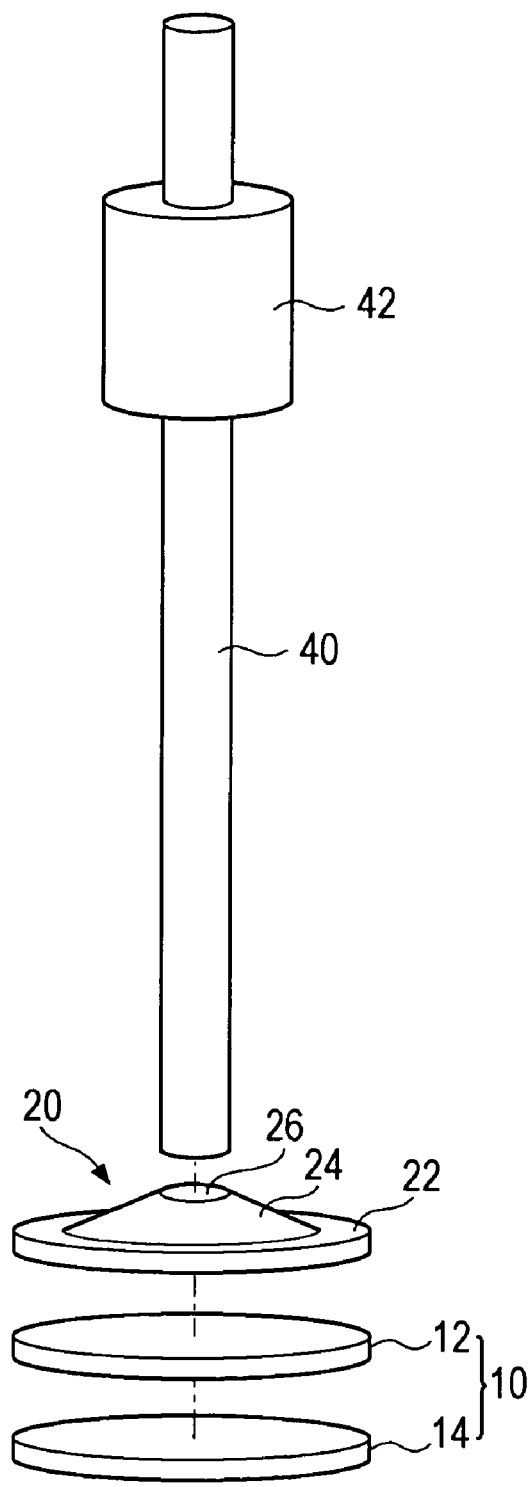
FIG. 5 is an exploded perspective view showing a preferred embodiment of a piezoelectric linear motor constructed in accordance with the present invention.
Figure 6:
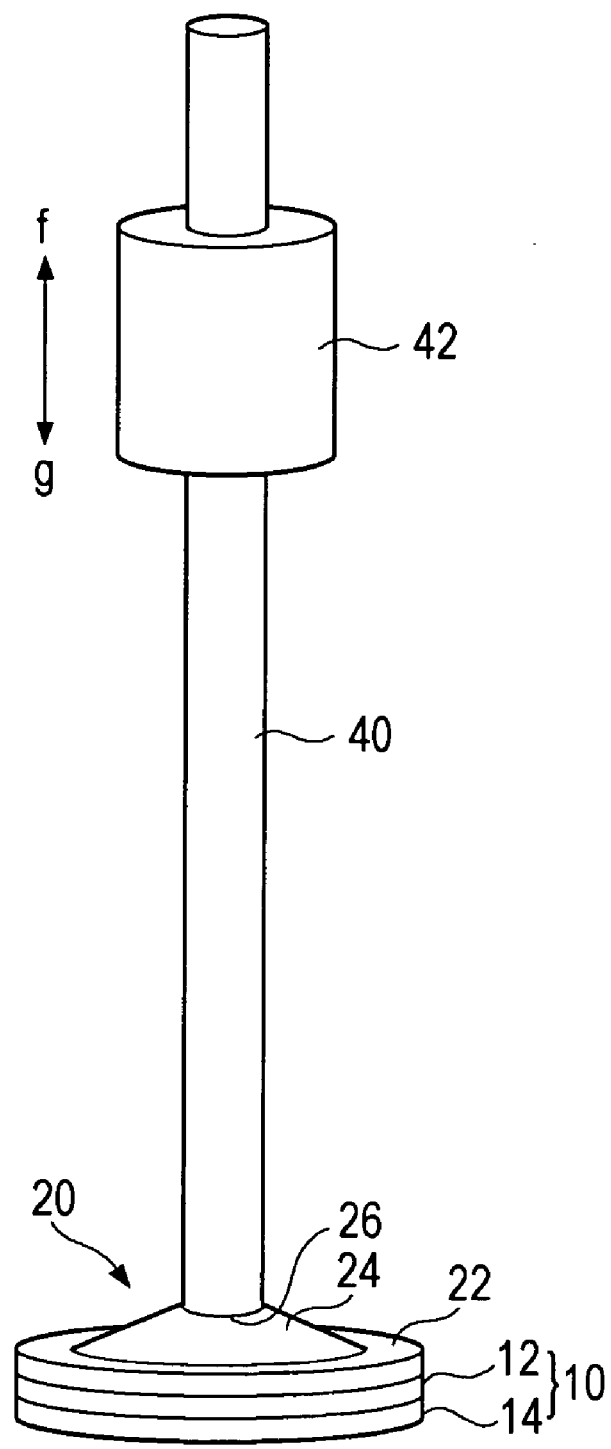
FIG. 6 is a perspective view of a piezoelectric linear motor of FIG. 5.

FIGS. 5 and 6 show a preferred embodiment of a piezoelectric linear motor constructed in accordance with the present invention.

As shown in the drawings, the piezoelectric linear motor comprises the above-described piezoelectric actuator 10, the displacement amplifying means 20, a shaft 40 whose one end is coupled to the top plate 26 of the displacement amplifying means 20 and extending along the z-axis (see FIG. 2), and a hollow cylindrical moving element 42 fitted movably around the shaft 40. The moving element 42 frictionally interacts with the shaft 40.

When the voltage is applied to the piezoelectric ceramic 12, the shaft 40 moves axially by the expansion or contraction of the piezoelectric actuator 10. When the shaft 40 axially moves relatively slowly, the moving element 42 is displaced together with the shaft 40 by the friction therebetween. However, when the shaft 40 axially moves relatively fast, since the friction-acting time is shortened, the moving element 42 is not displaced by inertia and only the shaft 40 moves axially. As the low-speed forward movement (as indicated by arrow f) and the high-speed backward movement (as indicated by arrow g) of the shaft 40 are repeated, the moving element 42 is continually displaced forward. However, as the low-speed backward movement and the high-speed forward movement of the shaft 40 are repeated, the moving element 42 is continually displaced backward. The displacement of the shaft 40 and the moving element 42 can be amplified by the above-described elastic geometrical deformation of the displacement amplifying means 20 and the convex (or concave) deformation of the elastic member 14.

Figure 7:
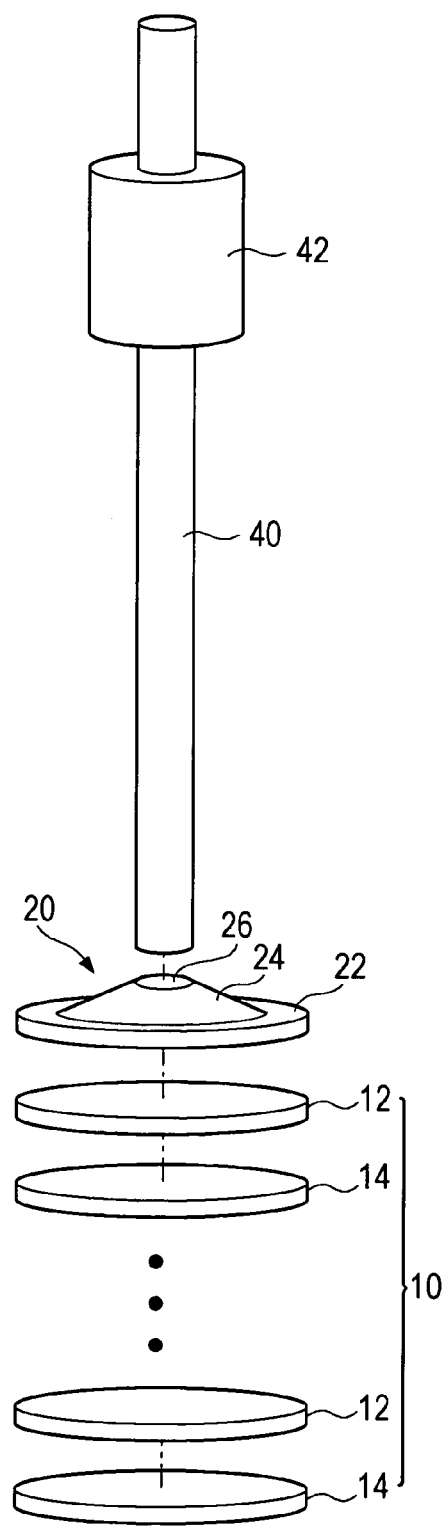
FIG. 7 is an exploded perspective view showing another preferred embodiment of a piezoelectric linear motor constructed in accordance with the present invention.

FIG. 7 is an exploded perspective view showing another preferred embodiment of a piezoelectric linear motor constructed in accordance with the present invention.

As shown in the drawing, the piezoelectric actuator 10 includes two or more piezoelectric ceramics 12 and two or more elastic members 14 that are layered alternately upon one another. Such a multilayer structure of the piezoelectric actuator 10 can better prevent the deterioration of the durability of the motor caused by the brittleness of the piezoelectric ceramics 12, and can maximize the displacement amplifying effect and the driving force of the motor.

Although the piezoelectric ceramic 12, the elastic member 14 and the displacement amplifying means 20 illustrated in FIGS. 5 to 7 have a circle-shaped planar cross-section, they are not limited thereto. For example, the above elements may have a polygon-shaped planar cross-section.

As described above in detail, a piezoelectric linear motor with displacement amplifying means according to the present invention can displace a moving element to a target position with a higher speed and a larger driving force by the elastic geometrical deformation of the displacement amplifying means.

Also, by attaching an elastic member to a piezoelectric ceramic, the deterioration of the durability of the motor caused by the brittleness of the ceramic can be prevented.

The present invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes, which come within the equivalent meaning and range of the claims, are to be embraced within their scope.

What is claimed is:

1. A piezoelectric linear motor, comprising:
   a piezoelectric actuator sized and configured to expand and contract, the piezoelectric actuator including a plate-shaped piezoelectric ceramic sized and configured to expand and contract when a voltage is applied and a plate-shaped elastic member attached to the piezoelectric ceramic and deformed to have a convex cross-section when the piezoelectric ceramic expands and a concave cross-section when the piezoelectric ceramic contracts;
   a shaft axial-movably connected to the piezoelectric actuator;
   a moving element mounted to the shaft, the moving element being frictionally displaced relative to the shaft; and
   means for amplifying the displacement of the shaft and the moving element, the means being disposed between the piezoelectric actuator and the shaft, the means including a base plate attached to the piezoelectric ceramic, a slanted plate conically extending from the base plate, and a top plate formed at the center of the slanted plate to which the shaft is coupled;
   wherein the means for amplifying the displacement is elastically deformed when the piezoelectric actuator expands or contracts to thereby axially move the shaft with an amplified displacement, and
   wherein the base plate is deformed to have a convex cross-section when the piezoelectric ceramic expands and a concave cross-section when the piezoelectric ceramic contracts, and
   wherein the top plate moves along the axis of the shaft according to the deformation of the base plate.

2. The piezoelectric linear motor of claim 1, wherein the piezoelectric actuator further includes one or more piezoelectric ceramics and one or more elastic members layered alternately upon one another.

* * * * *